(12) United States Patent
Payne

(10) Patent No.: US 8,248,290 B2
(45) Date of Patent: Aug. 21, 2012

(54) MULTIPLEXED AMPLIFIER WITH REDUCED GLITCHING

(75) Inventor: Robert F. Payne, Lucas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 100 days.

(21) Appl. No.: 12/880,311

(22) Filed: Sep. 13, 2010

(65) Prior Publication Data

US 2012/0062402 A1 Mar. 15, 2012

(51) Int. Cl.
*H03M 1/34* (2006.01)

(52) U.S. Cl. ........................................ 341/162; 341/161

(58) Field of Classification Search .................. 341/162, 341/161, 155, 159; 327/52, 57, 97
See application file for complete search history.

(56) References Cited

U.S. PATENT DOCUMENTS

| | | | |
|---|---|---|---|
| 3,877,023 A | 4/1975 | Spicer et al. | |
| 5,180,932 A | 1/1993 | Bengel | |
| 5,530,444 A | 6/1996 | Tice et al. | |
| 5,867,053 A | 2/1999 | Engles et al. | |
| 6,218,887 B1 | 4/2001 | Brown | |
| 6,489,845 B1 | 12/2002 | Maschhoff | |
| 7,817,077 B2 * | 10/2010 | Miyashita | ..................... 341/161 |

OTHER PUBLICATIONS

"A 9.4-bit, 50-MS/s, 1.44-mW Pipelined ADC Using Dynamic Source Follower Residue Amplification," IEEE Journal of Solid-State Circuits, vol. 44, No. 4, Apr. 2009, pp. 1057-1066 (Hu, et al.).
"A 12-bit 75-MS/s Pipelined ADC Using Open-Loop Residue Amplification," IEEE Journal of Solid-State Circuits, vol. 38, No. 12, Dec. 2003, pp. 2040-2050 (Murmann, et al.).
"A 10b 100MS/s 25.2mW 0.18μm CMOS ADC With Various Circuit Sharing Techniques," 2009 International SoC Design Conference, Nov. 22-24, 2009, pp. 329-332 (Park,et al.).

* cited by examiner

*Primary Examiner* — Joseph Lauture
(74) *Attorney, Agent, or Firm* — John J. Patti; Wade J. Brady, III; Frederick J. Telecky, Jr.

(57) ABSTRACT

In many applications, which use amplifiers that operate at less than 50% duty cycle, it would be advantageous to reduce the number amplifiers to reduce power consumption. Here, an amplifier is provided which is time multiplexed to accommodate multiple data paths. Additionally, reset circuitry or a reset mechanism is provided at the output terminals of this amplifier to briefly short the output terminals to generally prevent glitching that may result from switching between data paths.

17 Claims, 3 Drawing Sheets

MULTIPLEXED AMPLIFIER WITH REDUCED GLITCHING

TECHNICAL FIELD

The invention relates generally to amplifiers and, more particularly, to residue amplifiers.

BACKGROUND

Referring to FIG. 1A of the drawings, reference numeral 100 generally designates a conventional analog-to-digital converter (ADC) 100. ADC 100 generally comprises several stages 102-1 to 102-N, an ADC 106 (which is typically a flash ADC), and a digital output circuit 104. The stages 102-1 to 102-N are generally coupled in series with one another in a sequence, where the first stage 102-1 receives the analog input signal and where each of the subsequent stages 102-2 to 102-N receives a residue signal from the previous stage 102-1 to 102-(N−1), respectively. ADC 106 is coupled to the last stage 102-N (receiving its residue signal). Based on its input signal (either a residue signal or the analog input signal), stages 102-1 to 102-N and ADC 106 are able to resolve a portion of the analog input signal, which is provided to digital output circuit 104. Digital output circuit 104 can then perform error correction or other digital processing to generate the digital output signal DOUT.

Turning now to FIGS. 1B and 1C, stages 102-1 to 102-N can be seen in greater detail (which are referred to hereinafter as stage 102 for the sake of simplicity). Stage 102 generally comprises a track-and-hold (T/H) circuit 108 (i.e., T/H amplifier), ADC 110, digital-to-analog converter (DAC) 112, adder 114, and a residue amplifier 116. In operation, the T/H circuit 110 enters a track phase T during the logic high state of the clock signal CLK and a hold phase H during the logic low state of the clock signal CLK. During the track phase T, the T/H circuit samples its analog input signal SIN (which may be the analog input signal AIN or the residue signal from the previous stage). During the hold phase H, the sampled signal is provided to ADC 110 and adder 114. The ADC 110 resolves a portion of the signal SIN, providing the resolved bits to digital output circuit 104 and DAC 112. DAC 112 converts the resolved bits to an analog signal which is provided to adder 114. Adder 114 determines the difference between the sampled signal and the analog signal from DAC, which is amplified by amplifier 116 and output as a residue signal ROUT.

There are some drawbacks to ADC 100. In particular, the residue amplifiers 116 for each stage 102-1 to 102-N are operating at less than 50% duty cycle, which consumes an excess amount of power. Therefore, it is desirable to have a reside amplifier that consumes less power.

Some examples of other conventions circuits are: U.S. Pat. No. 3,877,023; U.S. Pat. No. 5,180,932; U.S. Pat. No. 6,218,887; and U.S. Pat. No. 6,489,845.

SUMMARY

A preferred embodiment of the present invention, accordingly, provides an apparatus. The apparatus comprises an amplifier having a first input terminal, a second input terminal, a first output terminal, and a second input terminal; a first multiplexer that is coupled to the first input terminal of the amplifier; a second multiplexer that is coupled to the second input terminal of the amplifier; a switch that is coupled between the first and second output terminals of the amplifier; a pulse generator that is coupled to the switch so as to control the switch; and a controller that is coupled to the first multiplexer, the second multiplexer, and pulse generator, wherein the controller provides a select signal to each of the first and second multiplexers, and wherein the controller activates the pulse generator when the first and second multiplexers are switched.

In accordance with a preferred embodiment of the present invention, the pulse generator further comprises: a logic circuit that is coupled to the controller so as to receive the select signal and that is coupled to the switch; and a delay circuit that is coupled to the controller so as to receive the select signal and that is coupled to the switch.

In accordance with a preferred embodiment of the present invention, the logic circuit further comprises a XOR gate.

In accordance with a preferred embodiment of the present invention, the amplifier further comprises: a first transistor having a first passive electrode, a second passive electrode, and a control electrode, wherein the control electrode of the first transistor is coupled to the first multiplexer; a second transistor having a first passive electrode, a second passive electrode, and a control electrode, wherein the control electrode of the second transistor is coupled to the second multiplexer, and wherein the first passive electrode of the second transistor is coupled to the first passive electrode of the first transistor; a first current source that is coupled to the second passive electrode of the first transistor; a second current source that is coupled to the second passive electrode of the second transistor; a first bias transistor that is coupled between the first currents source and the first output terminal; and a second bias transistor that is coupled between the second current source and the second output terminal.

In accordance with a preferred embodiment of the present invention, the first and second transistors are NPN transistors.

In accordance with a preferred embodiment of the present invention, an apparatus is provided. The apparatus comprises data converter circuitry; a first multiplexer that is coupled to the data converter circuitry; a second multiplexer that is coupled to the data converter circuitry; an amplifier having a first input terminal, a second input terminal, a first output terminal, and a second input terminal, wherein the first multiplexer that is coupled to the first input terminal of the amplifier, and wherein the second multiplexer that is coupled to the second input terminal of the amplifier; a switch that is coupled between the first and second output terminals of the amplifier; a pulse generator that is coupled to the switch so as to control the switch; and a controller that is coupled to the first multiplexer, the second multiplexer, and pulse generator, wherein the controller provides a select signal to each of the first and second multiplexers, and wherein the controller activates the pulse generator when the first and second multiplexers are switched.

In accordance with a preferred embodiment of the present invention, the data converter circuitry further comprises: a first track-and-hold (T/H) circuit; a second T/H circuit; a first analog-to-digital converter (ADC) that is coupled to the first T/H circuit; a second ADC that is coupled to the second T/H circuit; a first digital-to-analog converter (DAC) that is coupled to the first ADC; a second DAC that is coupled to the second ADC; a first adder that is coupled to the first DAC, the first T/H circuit, and the first multiplexer, wherein the first adder determines the difference between the outputs of the first T/H circuit and the first DAC; and a second adder that is coupled to the second DAC, the second T/H circuit, and the second multiplexer, wherein the second adder determines the difference between the outputs of the second T/H circuit and the second DAC.

In accordance with a preferred embodiment of the present invention, an apparatus is provided. The apparatus comprises a plurality of stages that are coupled in series with one another in a sequence, wherein each stage receives an analog input signal or a residue signal from the previous stage, and wherein each stage includes: data converter circuitry; a first multiplexer that is coupled to the data converter circuitry; a second multiplexer that is coupled to the data converter circuitry; an amplifier having a first input terminal, a second input terminal, a first output terminal, and a second input terminal, wherein the first multiplexer that is coupled to the first input terminal of the amplifier, and wherein the second multiplexer that is coupled to the second input terminal of the amplifier; a switch that is coupled between the first and second output terminals of the amplifier; a pulse generator that is coupled to the switch so as to control the switch; and a controller that is coupled to the first multiplexer, the second multiplexer, and pulse generator, wherein the controller provides a select signal to each of the first and second multiplexers, and wherein the controller activates the pulse generator when the first and second multiplexers are switched; an ADC that is coupled to the last stage of the sequence; and a digital output circuit that is coupled to the ADC and the data converter circuit for each stage.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1A:
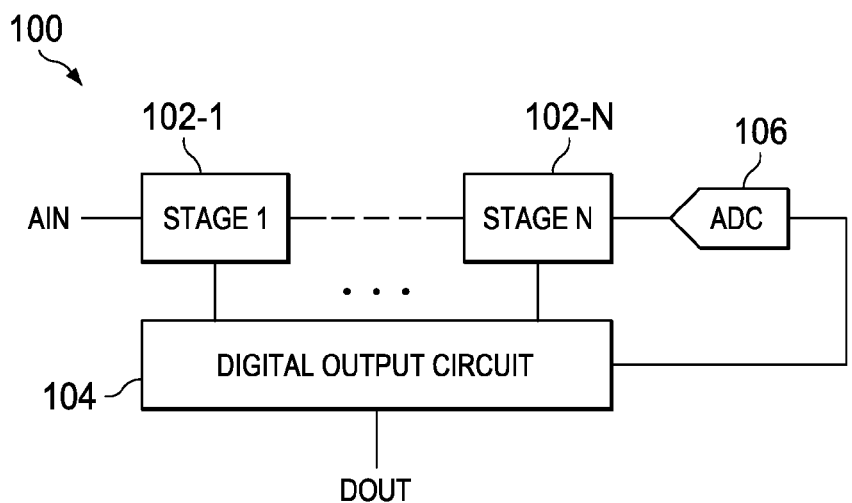
FIGS. 1A and 1B are circuit diagrams for an example of a conventional ADC.
Figure 1B:
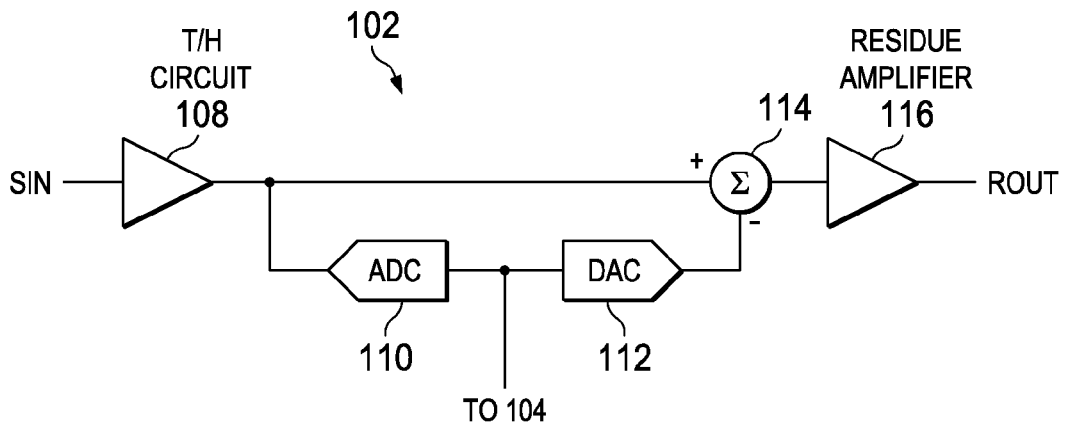
Figure 1C:
FIG. 1C is a timing diagram for the ADC of FIGS. 1A and 1B.

Refer now to the drawings wherein depicted elements are, for the sake of clarity, not necessarily shown to scale and wherein like or similar elements are designated by the same reference numeral through the several views.

Figure 2A:
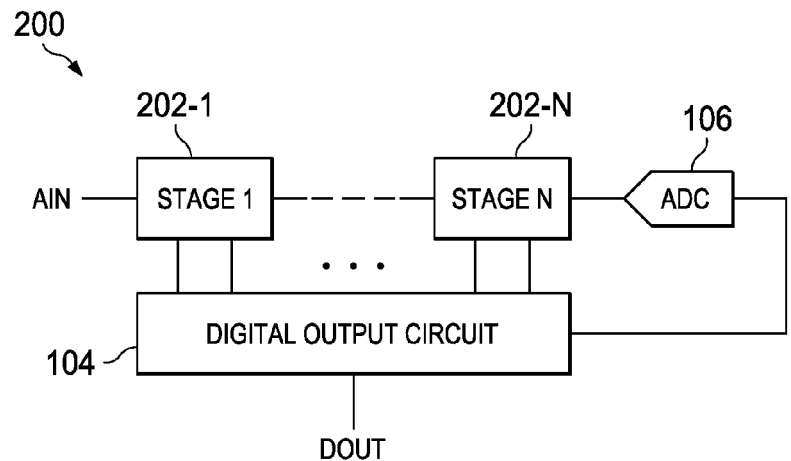
FIGS. 2A and 2B are circuit diagrams for an example of an ADC in accordance with a preferred embodiment of the present invention.

Turning to FIG. 2A, an example of an ADC 200 in accordance with a preferred embodiment of the present invention can be seen. ADC 200 has the same general functionality as ADC 100. However, a difference exists in the pipeline; namely, stages 102-1 to 102-N have been replaced by stages 202-1 to 202-N.

Figure 2B:
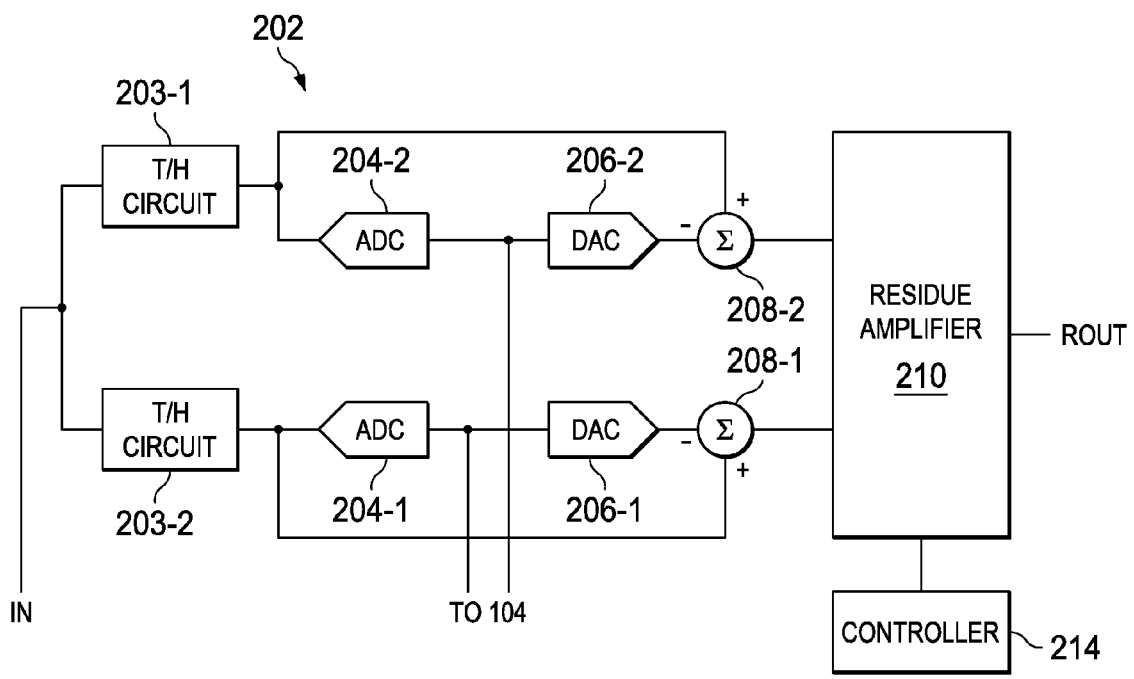

Looking to FIG. 2B, stages 202-1 to 203-N (hereinafter 202) can be seen in greater detail. In operation, T/H circuit 203-1 and 203-2 are coupled to receive an analog input signal IN (which is either the analog input signal AIN or a residue signal from the previous stage). Since these T/H circuits 203-1 and 203-2 are arranged in parallel with one another, T/H circuits 203-1 and 203-2 can be timed so as to sample on generally non-overlapping logic stages or phases of a clock signal. T/H circuits 203-1 and 203-2 are respectively coupled to ADC 204-1 and 204-2, and ADCs 204-1 and 204-2, DACs 206-1 and 206-2, adders 208-1 and 208-2, and residue amplifier 210 can then perform analog processing to resolve sampled signals for digital output circuit 104 and to generate a residue signal ROUT.

Here, each of the data converter circuits (which respectively include ADCs 204-1 or 204-2, DAC 206-1 or 206-2, and adder 208-1 or 208-2) benefit from the use of a single amplifier. A reason is that duty cycle of an amplifier (for each data converter circuit) would be less than 50%, which would consume an excessive amount of power. Therefore, amplifier 210 can be time multiplexed by controller 214 to process signals from each of the data converter circuits or data paths.

Figure 2C:
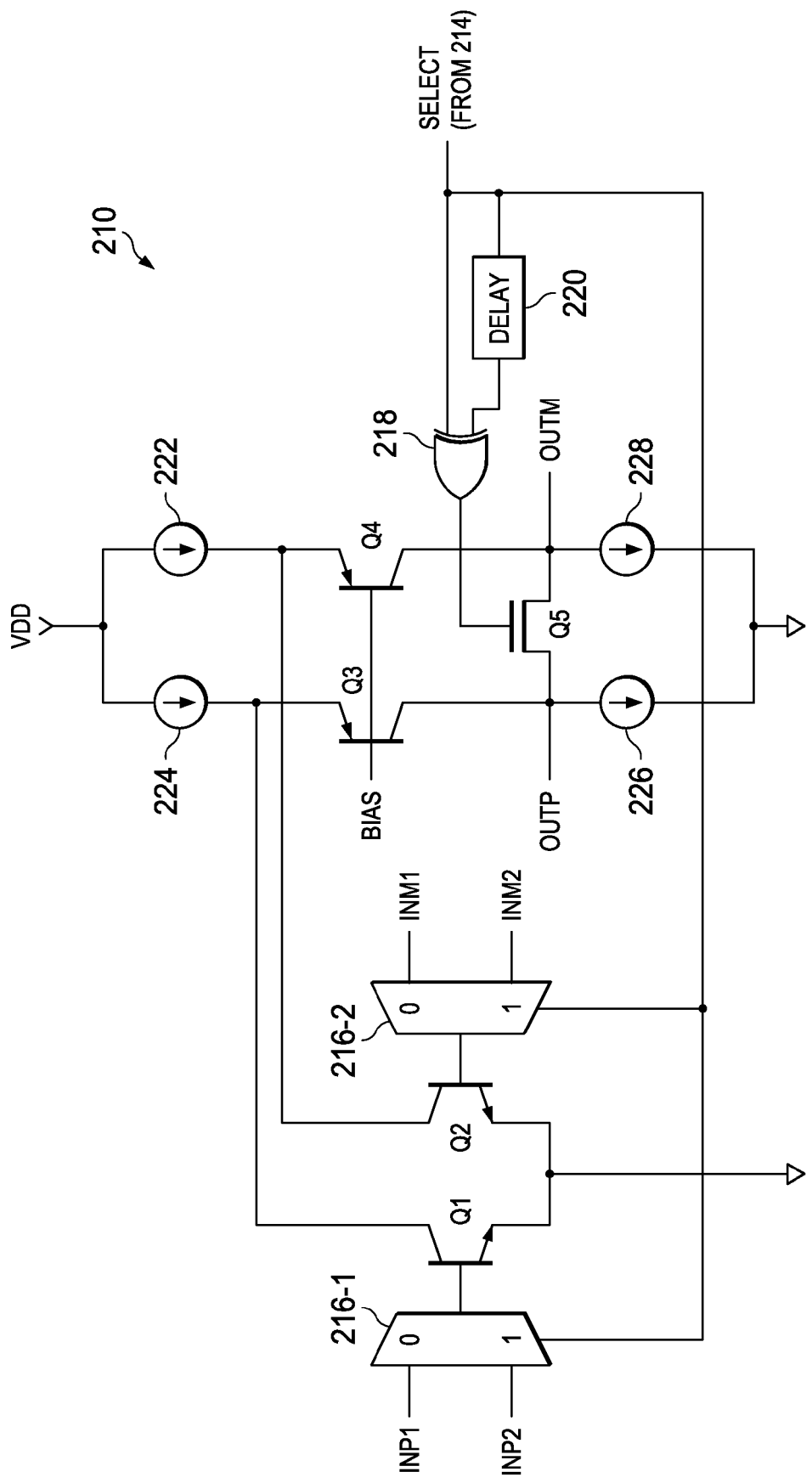
FIG. 2C is a circuit diagram of an example of a residue amplifier of FIG. 2B.

Turning to FIG. 2C, residue amplifier 210 can be seen in greater detail. In this example, a folded cascode differential amplifier (which generally comprises NPN transistors Q1 through Q4 and current sources 222, 224, 226, and 228) that is biased by a bias voltage BIAS is employed. Coupled to the input terminals of this amplifier are multiplexers 216-1 and 216-2. The switching between differential input signals INP1/INM1 and INP2/INM2 (which are provided by adders 208-1 and 208-2, respectively) are controlled through the select signal SELECT (which is provided by the controller 214). Additionally, multiplexers (not shown) that are coupled to the output terminals of this amplifier (so as to receive output signals OUTP and OUTM) to direct the correct input and output signals to the amplifier at the correct instants in time for processing.

When multiplexers 216-1 and 216-2 are switched, however, the amplifier (which generally comprises NPN transistors Q1 through Q4 and current sources 222, 224, 226, and 228) exhibits erratic behavior at the switching instant. This erratic behavior is referred to as a glitch, and if not addressed, the glitch can consume significant amounts of the amplifier's available settling time or even lead to the amplifier output or interior nodes operating at voltages outside their desired ranges. In other words, this glitch can degrade performance. To combat this problem, a reset mechanism is provided at the output terminals of the amplifier. The resent mechanism generally comprises a switch Q5 that is coupled between the output terminals of the amplifier and controlled by a pulse generator (which generally comprises an XOR gate and a delay circuit). Thus, on a rising or falling edge of the select signal SELECT, a pulse is provided to switch Q5 (which activates the switch Q5) so as to briefly short the output terminals of the amplifier together. Thus, glitching can be avoided, which results in faster settling times.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   an amplifier having a first input terminal, a second input terminal, a first output terminal, and a second output terminal;
   a first multiplexer that is coupled to the first input terminal of the amplifier;
   a second multiplexer that is coupled to the second input terminal of the amplifier;
   a switch that is coupled between the first and second output terminals of the amplifier;
   a pulse generator that is coupled to the switch so as to control the switch; and
   a controller that is coupled to the first multiplexer, the second multiplexer, and pulse generator, wherein the controller provides a select signal to each of the first and second multiplexers, and wherein the controller activates the pulse generator when the first and second multiplexers are switched.

2. The apparatus of claim 1, wherein the pulse generator further comprises:
   a logic circuit that is coupled to the controller so as to receive the select signal and that is coupled to the switch; and
   a delay circuit that is coupled to the controller so as to receive the select signal and that is coupled to the switch.

3. The apparatus of claim 2, wherein the logic circuit further comprises a XOR gate.

4. The apparatus of claim 3, wherein the amplifier further comprises:
   a first transistor having a first passive electrode, a second passive electrode, and a control electrode, wherein the control electrode of the first transistor is coupled to the first multiplexer;
   a second transistor having a first passive electrode, a second passive electrode, and a control electrode, wherein the control electrode of the second transistor is coupled to the second multiplexer, and wherein the first passive electrode of the second transistor is coupled to the first passive electrode of the first transistor;
   a first current source that is coupled to the second passive electrode of the first transistor;
   a second current source that is coupled to the second passive electrode of the second transistor;
   a first bias transistor that is coupled between the first currents source and the first output terminal; and
   a second bias transistor that is coupled between the second current source and the second output terminal.

5. The apparatus of claim 4, wherein the first and second transistors are NPN transistors.

6. An apparatus comprising:
   data converter circuitry;
   a first multiplexer that is coupled to the data converter circuitry;
   a second multiplexer that is coupled to the data converter circuitry;
   an amplifier having a first input terminal, a second input terminal, a first output terminal, and a second output terminal, wherein the first multiplexer is coupled to the first input terminal of the amplifier, and wherein the second multiplexer is coupled to the second input terminal of the amplifier;
   a switch that is coupled between the first and second output terminals of the amplifier;
   a pulse generator that is coupled to the switch so as to control the switch; and
   a controller that is coupled to the first multiplexer, the second multiplexer, and pulse generator, wherein the controller provides a select signal to each of the first and second multiplexers, and wherein the controller activates the pulse generator when the first and second multiplexers are switched.

7. The apparatus of claim 6, wherein the pulse generator further comprises:
   a logic circuit that is coupled to the controller so as to receive the select signal and that is coupled to the switch; and
   a delay circuit that is coupled to the controller so as to receive the select signal and that is coupled to the switch.

8. The apparatus of claim 7, wherein the logic circuit further comprises a XOR gate.

9. The apparatus of claim 8, wherein the amplifier further comprises:
   a first transistor having a first passive electrode, a second passive electrode, and a control electrode, wherein the control electrode of the first transistor is coupled to the first multiplexer;
   a second transistor having a first passive electrode, a second passive electrode, and a control electrode, wherein the control electrode of the second transistor is coupled to the second multiplexer, and wherein the first passive electrode of the second transistor is coupled to the first passive electrode of the first transistor;
   a first current source that is coupled to the second passive electrode of the first transistor;
   a second current source that is coupled to the second passive electrode of the second transistor;
   a first bias transistor that is coupled between the first currents source and the first output terminal; and
   a second bias transistor that is coupled between the second current source and the second output terminal.

10. The apparatus of claim 9, wherein the first and second transistors are NPN transistors.

11. The apparatus of claim 8, wherein the data converter circuitry further comprises:
    a first track-and-hold (T/H) circuit;
    a second T/H circuit;
    a first analog-to-digital converter (ADC) that is coupled to the first T/H circuit;
    a second ADC that is coupled to the second T/H circuit;
    a first digital-to-analog converter (DAC) that is coupled to the first ADC;
    a second DAC that is coupled to the second ADC;
    a first adder that is coupled to the first DAC, the first T/H circuit, and the first multiplexer, wherein the first adder determines the difference between the outputs of the first T/H circuit and the first DAC; and
    a second adder that is coupled to the second DAC, the second T/H circuit, and the second multiplexer, wherein the second adder determines the difference between the outputs of the second T/H circuit and the second DAC.

12. An apparatus comprising:
    a plurality of stages that are coupled in series with one another in a sequence, wherein each stage receives an analog input signal or a residue signal from the previous stage, and wherein each stage includes:
    data converter circuitry;
    a first multiplexer that is coupled to the data converter circuitry;
    a second multiplexer is coupled to the data converter circuitry;
    an amplifier having a first input terminal, a second input terminal, a first output terminal, and a second output terminal, wherein the first multiplexer is coupled to the first input terminal of the amplifier, and wherein the second multiplexer that is coupled to the second input terminal of the amplifier;
a switch that is coupled between the first and second output terminals of the amplifier;
a pulse generator that is coupled to the switch so as to control the switch; and
a controller that is coupled to the first multiplexer, the second multiplexer, and pulse generator, wherein the controller provides a select signal to each of the first and second multiplexers, and wherein the controller activates the pulse generator when the first and second multiplexers are switched;
an ADC that is coupled to the last stage of the sequence; and
a digital output circuit that is coupled to the ADC and the data converter circuit for each stage.

13. The apparatus of claim 12, wherein the pulse generator further comprises:
a logic circuit that is coupled to the controller so as to receive the select signal and that is coupled to the switch; and
a delay circuit that is coupled to the controller so as to receive the select signal and that is coupled to the switch.

14. The apparatus of claim 13, wherein the logic circuit further comprises a XOR gate.

15. The apparatus of claim 14, wherein the amplifier further comprises:
a first transistor having a first passive electrode, a second passive electrode, and a control electrode, wherein the control electrode of the first transistor is coupled to the first multiplexer;
a second transistor having a first passive electrode, a second passive electrode, and a control electrode, wherein the control electrode of the second transistor is coupled to the second multiplexer, and wherein the first passive electrode of the second transistor is coupled to the first passive electrode of the first transistor;
a first current source that is coupled to the second passive electrode of the first transistor;
a second current source that is coupled to the second passive electrode of the second transistor;
a first bias transistor that is coupled between the first currents source and the first output terminal; and
a second bias transistor that is coupled between the second current source and the second output terminal.

16. The apparatus of claim 15, wherein the first and second transistors are NPN transistors.

17. The apparatus of claim 14, wherein the data converter circuitry further comprises:
a first track-and-hold (T/H) circuit;
a second T/H circuit;
a first analog-to-digital converter (ADC) that is coupled to the first T/H circuit;
a second ADC that is coupled to the second T/H circuit;
a first digital-to-analog converter (DAC) that is coupled to the first ADC;
a second DAC that is coupled to the second ADC;
a first adder that is coupled to the first DAC, the first T/H circuit, and the first multiplexer, wherein the first adder determines the difference between the outputs of the first T/H circuit and the first DAC; and
a second adder that is coupled to the second DAC, the second T/H circuit, and the second multiplexer, wherein the second adder determines the difference between the outputs of the second T/H circuit and the second DAC.

* * * * *